(12) United States Patent
Ino

(10) Patent No.: US 6,897,841 B2
(45) Date of Patent: May 24, 2005

(54) LIQUID CRYSTAL DISPLAY DEVICE AND ELECTRONIC APPARATUS COMPRISING IT

(75) Inventor: Masumitsu Ino, Kanagawa (JP)

(73) Assignee: Sony Corporation (JP)

(*) Notice: Subject to any disclaimer, the term of this patent is extended or adjusted under 35 U.S.C. 154(b) by 288 days.

(21) Appl. No.: 10/111,207

(22) PCT Filed: Aug. 23, 2001

(86) PCT No.: PCT/JP01/07204
§ 371 (c)(1),
(2), (4) Date: Aug. 21, 2002

(87) PCT Pub. No.: WO02/17007
PCT Pub. Date: Feb. 28, 2002

(65) Prior Publication Data
US 2003/0057853 A1 Mar. 27, 2003

(30) Foreign Application Priority Data
Aug. 24, 2000 (JP) .................................... 2000-254335

(51) Int. Cl.⁷ ................................................ G09G 3/36
(52) U.S. Cl. ........................................ 345/87; 345/100
(58) Field of Search ............................ 345/87, 90, 91, 345/92, 93, 100, 204, 205, 206, 207, 211, 212, 214

(56) References Cited

U.S. PATENT DOCUMENTS 5,453,858 A 9/1995 Yamazaki ................... 359/59
6,549,260 B1 * 4/2003 Shibahara .................. 349/155
6,697,040 B2 * 2/2004 Imajo et al. ................. 345/98
2002/0186192 A1 * 12/2002 Maruoka et al. ............. 345/87

FOREIGN PATENT DOCUMENTS

| EP | 1039331 | 9/2000 |
|----|---------|--------|
| JP | 4-242724 | 8/1992 |
| JP | 2000-276068 | 10/2000 |

* cited by examiner

Primary Examiner—Vijay Shankar
(74) Attorney, Agent, or Firm—Rader, Fishman & Grauer PLLC; Ronald P. Kananen (57) ABSTRACT

A liquid crystal display device enabling realization of greater thinness, smaller area, and narrower frame and an electronic device using the same are provided. For this purpose, the liquid crystal display device of the present invention comprises a first substrate, a pixel unit formed on the first substrate and having pixels arranged in a matrix, a second substrate arranged facing the first substrate, a liquid crystal composition held between the first substrate and the second substrate, and peripheral circuits formed on the first substrate for writing pixel signals to the pixel unit, at least part of the peripheral circuits of the above peripheral circuits being formed by thin film transistors on the first substrate, the remaining part of the peripheral circuits of the above peripheral circuits being formed by semiconductor chips, and the semiconductor chips being arranged on the first substrate so that at least part of the semiconductor chips overlap the regions of the peripheral circuits formed by the thin film transistors.

20 Claims, 12 Drawing Sheets

LIQUID CRYSTAL DISPLAY DEVICE AND ELECTRONIC APPARATUS COMPRISING IT

TECHNICAL FIELD

The present invention relates to a liquid crystal display device and an electronic device using the same, more particularly relates to a liquid crystal display device used for a portable electronic device where greater thinness, smaller area, and a narrower frame are demanded and to an electronic device using the same as a display unit.

BACKGROUND ART

Thin, low power consuming panel displays have come to be used in large numbers as display devices for television receivers, computers, and portable terminals in recent years.

As such a panel display, there is known an active matrix type display device comprised of a large number of pixels using for example TFTs (thin film transistors) as switching elements arranged in a matrix on a glass substrate or other transparent insulating substrate (panel) in combination with liquid crystals or other substances having an electro-optic effect.

As such an active matrix type display device, Japanese Unexamined Patent Publication (Kokai) No. 4-242724 provides a liquid crystal display device forming part of the peripheral circuits formed on the substrate for driving the pixel unit by complementary TFTs similar to the active elements connected to the pixels and forming the remaining peripheral circuits by semiconductor chips.

Figure 1A:
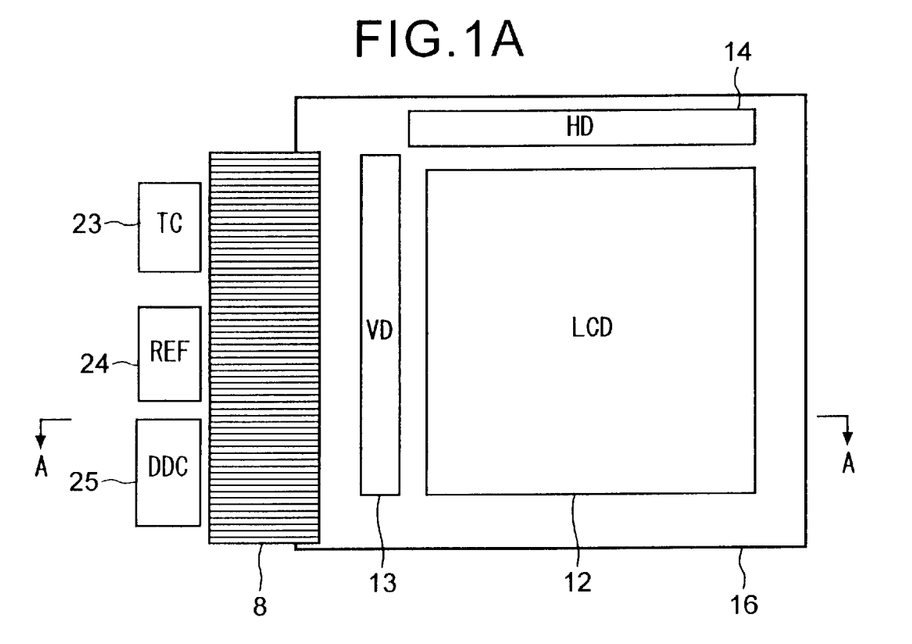
Figure 1B:
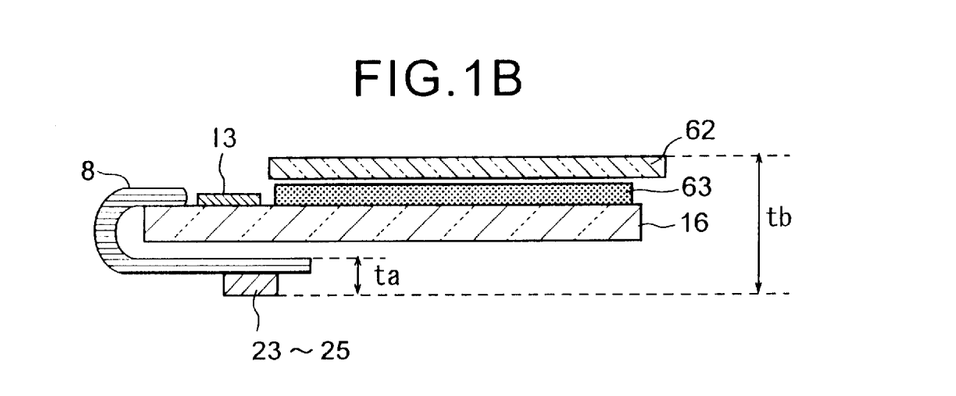
FIG. 1B is a sectional view along the line A—A of FIG. 1A.

FIG. 1A is a schematic view of the configuration of a liquid crystal display device as represented by the above Japanese Unexamined Patent Publication (Kokai) No. 4-242724, while FIG. 1B is a sectional view along the line A—A in FIG. 1A.

The liquid crystal display device shown in FIGS. 1A and 1B is a liquid crystal display device holding a liquid crystal layer 63 between a transparent insulating substrate 16 formed with for example a horizontal driver (HD) 14, vertical driver (VD) 13, and some other peripheral circuits formed by TFTs and a transparent insulating substrate arranged facing the same (counter substrate) 62, wherein the remaining peripheral circuits formed by semiconductor chips such as a timing controller (TC) 23, reference voltage generation circuit (REF) 24, and DC-DC converter (DDC) 25, that is, IC chips 23 to 25, are attached to the surface of the transparent insulating substrate 16 on the opposite side to the surface formed with the peripheral circuits 13 and 14 and are electrically connected with the peripheral circuits 13 and 14 by using a flexible cable 8.

Figure 2:
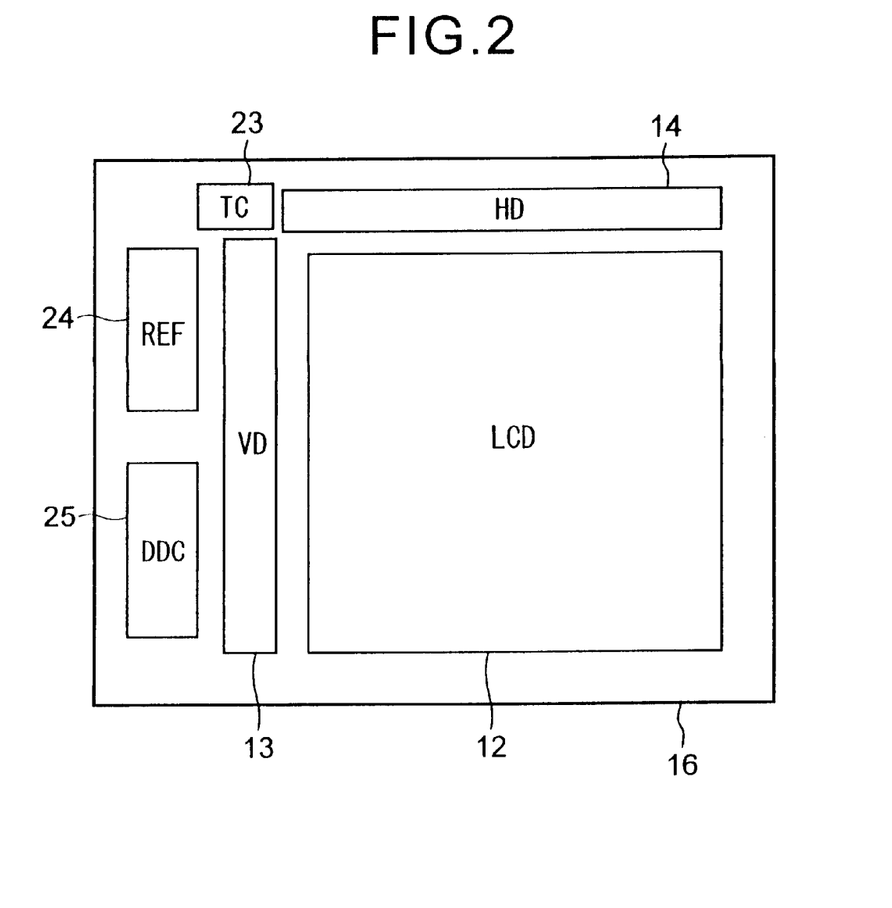
FIG. 2 is a schematic view of the configuration of a liquid crystal display device of a second prior art.

Alternatively, as shown in FIG. 2, the remaining peripheral circuits formed by semiconductor chips such as the timing controller (TC) 23, reference voltage generation circuit (REF) 24, and DC-DC converter (DDC) 25, that is, the IC chips 23 to 25, are attached to the same surface of the transparent insulating substrate 16 formed with the horizontal driver (HD) 14, vertical driver (VD) 13, and some other peripheral circuits formed by TFTs and are electrically connected with the peripheral circuits 13 and 14.

In the liquid crystal display devices shown in FIGS. 1A and 1B, however, as shown in FIG. 1B, the thickness tb of the liquid crystal display device as a whole ends up becoming greater by at least the extent of the thickness ta of the IC chips 23 to 25 and the flexible cable 8, for example, by about 1 mm.

Therefore, the thickness of the device using the liquid crystal display device as a display unit also ends up becoming greater. In portable terminals, in particular mobile phones, effort is being made to reduce the thicknesses of the devices. If the thickness tb of the liquid crystal display device used as the display unit of a mobile phone is great, this would obstruct the reduction of thickness of the mobile phone itself.

Further, in the liquid crystal display device shown in FIG. 2, the total area of the peripheral circuits formed by the TFTs and the remaining IC chips 23 to 25 becomes the area of the periphery (frame), so there is the disadvantage that compactness is impaired. Further, there is the disadvantage that the ratio of the effective display area (liquid crystal display unit) in the liquid crystal display device ends up becoming smaller.

DISCLOSURE OF INVENTION

An object of the present invention is to provide a liquid crystal display device enabling the realization of a greater thinness, smaller area, and narrower frame of the liquid crystal display device.

Another object of the present invention is to provide an electronic device enabling the realization of a greater thinness, smaller area, and narrower frame overall by mounting such a liquid crystal display device.

To achieve the above object, the liquid crystal display device of the present invention comprises a first substrate, a pixel unit formed on the first substrate and having pixels arranged in a matrix, a second substrate arranged facing the first substrate, a liquid crystal composition held between the first substrate and the second substrate, and peripheral circuits formed on the first substrate for writing pixel signals in the pixel unit, at least part of the peripheral circuits of the above peripheral circuits being formed by thin film transistors on the first substrate, the remaining part of the peripheral circuits of the above peripheral circuits being formed by semiconductor chips, and the semiconductor chips being arranged on the first substrate so that at least part of the semiconductor chips overlap the regions of the peripheral circuits formed by the thin film transistors.

Further, to achieve the object, an electronic device of the present invention has a display unit for giving a desired display, an operation unit, and a signal processing unit for causing the display unit to give a desired display in accordance with the content of operations by the operation unit, wherein the display unit has a first substrate, a pixel unit formed on the first substrate and having pixels arranged in a matrix, a second substrate arranged facing the first substrate, a liquid crystal composition held between the first substrate and the second substrate, and peripheral circuits formed on the first substrate for writing pixel signals to the pixel unit, at least part of the peripheral circuits of the above peripheral circuits being formed by thin film transistors on the first substrate, the remaining part of the peripheral circuits of the above peripheral circuits being formed by semiconductor chips, and the semiconductor chips being arranged on the first substrate so that at least part of the semiconductor chips overlap the regions of the peripheral circuits formed by the thin film transistors.

BRIEF DESCRIPTION OF DRAWINGS

FIG. 1A is a schematic view of the configuration of a liquid crystal display device of a first prior art, while

FIG. 3A is a schematic view of the configuration of circuits of a liquid crystal display device according to a first embodiment, while

FIG. 5A is a sectional view of a bottom gate structure polysilicon TFT, while

FIG. 8A is a view for explaining a method of connection of a control unit formed by silicon ICs and a vertical driver formed by polysilicon TFTs, while

BEST MODE FOR CARRYING OUT THE INVENTION

Preferred embodiments of the present invention will be explained next referring to the attached drawings.

First Embodiment

The present embodiment shows the application of the present invention to an active matrix type liquid crystal display device of an analog dot sequential driving system.

Figure 3A:
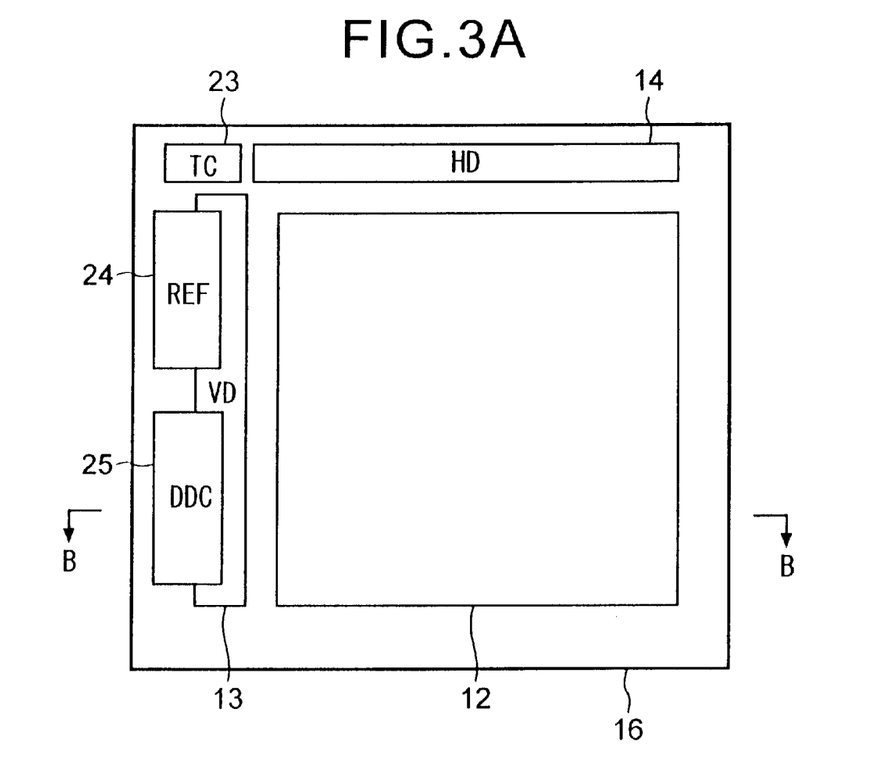
Figure 3B:
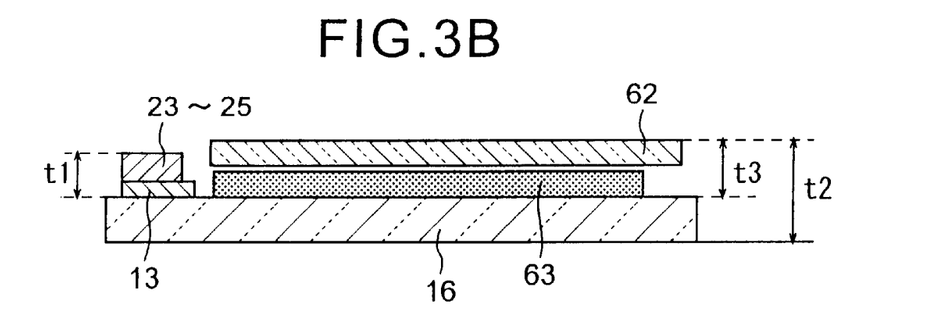
FIG. 3B is a sectional view along the line B—B in FIG. 3A.

FIG. 3A is a schematic view of the configuration of the circuits of a liquid crystal display device according to the present embodiment, while FIG. 3B is a sectional view along the line B—B in FIG. 3A.

Figure 4:
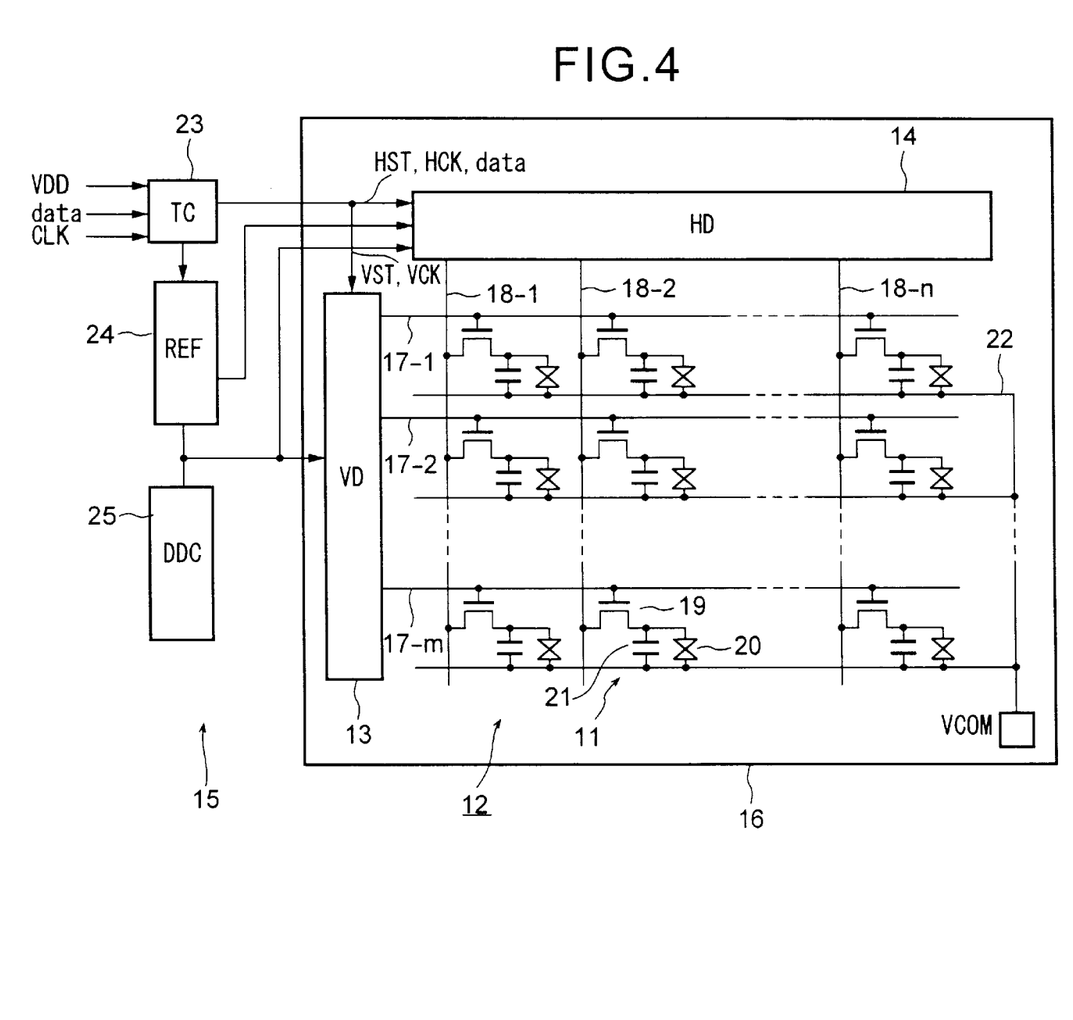
FIG. 4 is a schematic view of the electrical connections of circuits forming the liquid crystal display device according to the first embodiment.

Further, FIG. 4 is a schematic view of the electrical connections of the circuits forming the liquid crystal display device according to the present embodiment.

As shown in FIG. 3A and FIG. 4, the active matrix type liquid crystal display device according to the present embodiment has a liquid crystal display unit 12 comprised of a large number of pixels 11 arranged in a matrix, a vertical driver (VD) 13 for sequentially selecting the pixels 11 of the liquid crystal display unit 12 in row units, a horizontal driver (HD) 14 for writing pixel signals into the pixels 11 selected in row units, and a control unit 15 for controlling the vertical and horizontal drivers 13 and 14 mounted on a transparent insulating substrate 16.

In the liquid crystal display unit 12 on the transparent insulating substrate 16, m rows worth of gate lines (vertical selection lines) 17-1 to 17-*m* and *n* columns worth of signal lines (source lines) 18-1 to 18-*n* are arranged in a matrix. Further, a liquid crystal layer 63 is held with another transparent insulating substrate 62 arranged facing the substrate 16 across a predetermined distance. Pixels 11 are arranged at the intersections of the gate lines 17-1 to 17-*m* and the signal lines 18-1 to 18-*n*.

Each of the pixels 11 is comprised of a polysilicon TFT (thin film transistor) 19 serving as a switching element having a gate electrode connected to one of the gate lines 17-1 to 17-*m* and a source electrode connected to one of the signal lines 18-1 to 18-*n*, a liquid crystal cell (liquid crystal electrostatic capacity) 20 having a pixel electrode connected to a drain electrode of the TFT 19, and auxiliary electrostatic capacity 21 having one electrode connected to a drain electrode of the TFT 19.

In the above pixel structure, the counter electrode of the liquid crystal cell 20 is connected to a common line 22 along with the other electrode of the auxiliary electrostatic capacity 21.

The common line 22 is given a predetermined DC voltage as a common voltage VCOM.

The polysilicon TFTs which are used as the transistors used as switching elements of the liquid crystal display unit 12 and the transistors forming the vertical driver (VD) 13, horizontal driver (HD) 14, and other drive units include ones of bottom gate structures where the gate electrodes are arranged under gate insulating films and ones of top gate structures where the gate electrodes are arranged over the gate insulating films.

Figure 5A:
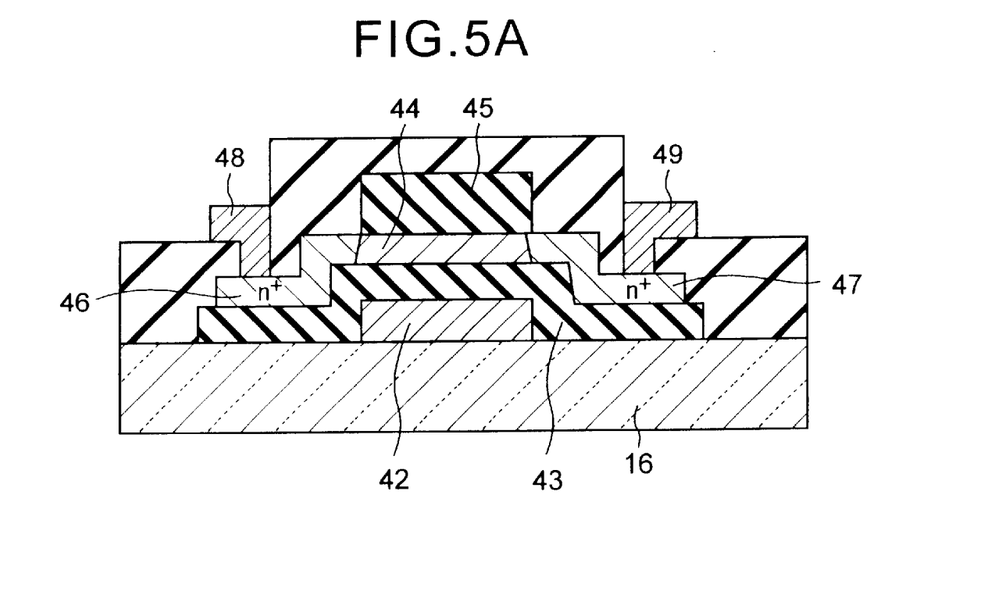
Figure 5B:
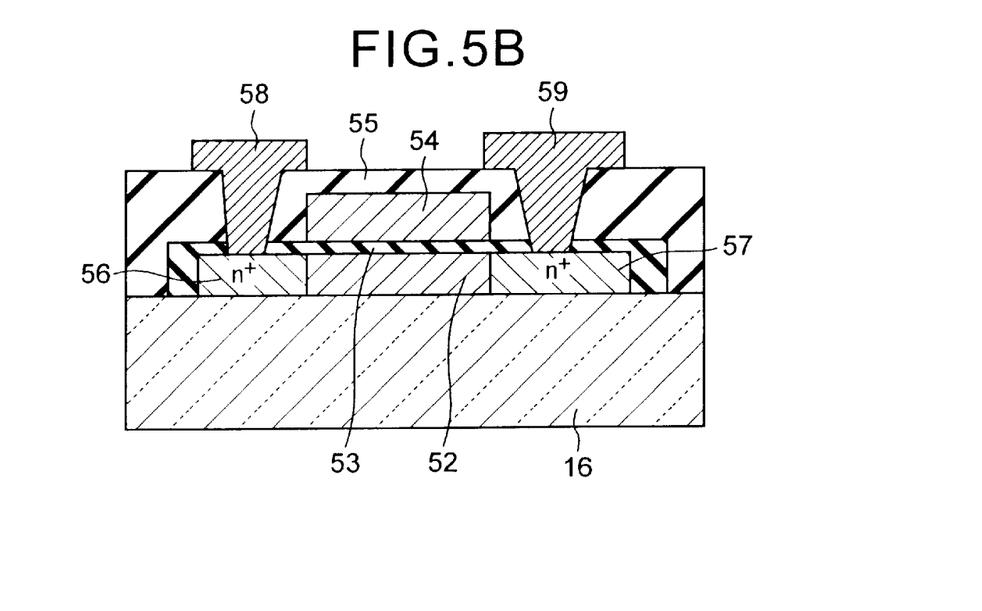
FIG. 5B is a sectional view of a top gate structure polysilicon TFT.

FIG. 5A is a sectional view of a bottom gate structure polysilicon TFT, while FIG. 5B is a sectional view of a top gate structure polysilicon TFT.

In the bottom gate structure TFT shown in FIG. 5A, a gate electrode 42 is formed on the transparent insulating substrate (glass substrate) 16, a polysilicon (Poly-Si) layer 44 is formed over the gate electrode 42 through a gate insulating film 43, and an interlayer insulating film 45 is formed covering this polysilicon layer 44.

Further, a source region 46 and drain region 47 comprised of an n$^+$diffusion layer are formed on the gate insulating film 43 at the sides of the gate electrode 42, and a source electrode 48 and drain electrode 49 comprised of aluminum interconnections are connected to these source and drain regions 46 and 47.

In the bottom gate structure TFT shown in FIG. 5B, a polysilicon layer 52 is formed on a transparent insulating substrate (glass substrate) 16, a gate electrode 54 is formed on the polysilicon layer 52 through a gate insulating film 53, and an interlayer insulating film 55 is formed covering the gate electrode 54.

Further, a source region 56 and a drain region 57 comprised of an n$^+$diffusion layer are formed on the transparent insulating substrate 16 at the sides of the polysilicon layer 52, and a source electrode 58 and drain electrode 59 comprised of aluminum interconnections are connected to these source and drain regions 56 and 57.

In the control unit 15, the timing controller (TC) 23 receives as input through a not shown TCP (tape carrier package) a power source voltage VDD from a not shown external power source unit, digital image data DATA from a not shown external CPU, and a clock CLK from a not shown external clock generator.

The timing controller 23 controls the timing while supplying a vertical start pulse VST, vertical clock VCK, and other clock signals and various control signals to the vertical driver (VD) 13 and a horizontal start pulse HST, a horizontal clock HCK, and other clock signals and various control signals to the horizontal driver (HD) 14.

The reference voltage generation circuit (REF) 24 generates a plurality of reference voltages different in value and gives these plurality of reference voltages as reference voltages to the later mentioned reference voltage selection type D/A converter 37 of the horizontal driver (HD) 14.

The DC-DC converter (DDC) 25 converts the low level DC voltage (low voltage) to two or more high DC voltages (high voltages) and gives them to the vertical driver (VD) 13, horizontal driver (HD) 14, reference voltage generation circuit 24, and other circuits.

In the present embodiment, as circuit parts driven at a high speed or circuit parts with small variance in characteristics, for example, the timing controller 23, reference voltage generation circuit 24, and DC-DC converter 25 of the control unit 15 are formed by single crystal silicon chips (ICs).

Further, the silicon ICs 23 to 25, as shown in FIG. 3B, are mounted on the vertical driver (VD) 13 by for example a COG (chip on glass) method.

The silicon ICs 23 to 25 formed by single crystal silicon can be driven even by 100 MHz.

On the other hand, as circuit parts driven at a low speed and with large variance in characteristics, for example, the vertical driver (VD) 13 and horizontal driver (HD) 14 are formed using polysilicon TFTs as explained above.

Figure 6:
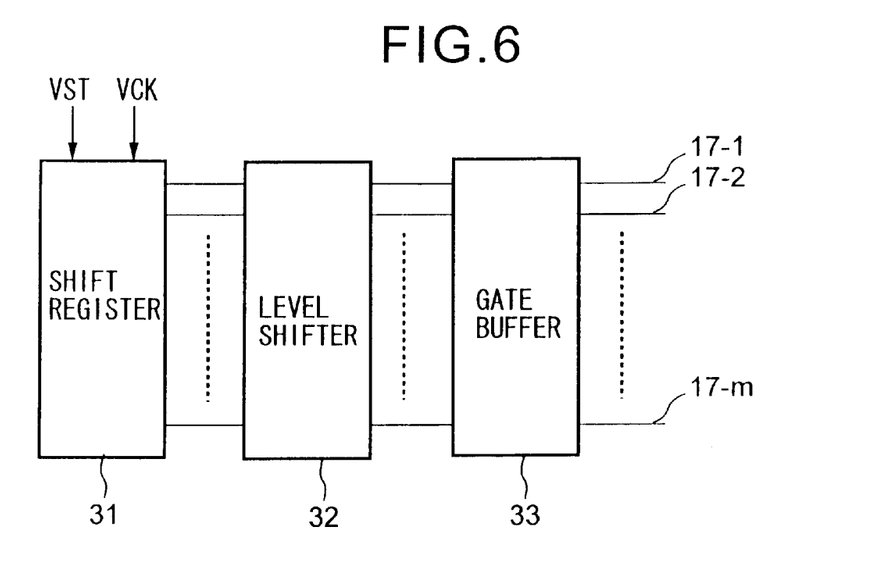
FIG. 6 is a block diagram of an example of the configuration of a vertical driver in an active matrix type liquid crystal display device of an analog dot sequential driving system.

The vertical driver (VD) 13, for example, as shown in FIG. 6, has a shift register 31, a level shifter 32, and a gate buffer 33.

When input with the vertical start pulse VST, the shift register 31 sequentially transfers the vertical start pulse VST synchronized with the vertical clock VCK and sequentially outputs shift pulses from the transfer stages.

The level shifter 32 boosts the shift pulses output from the transfer stages of the shift register 31 and supplies them to the gate buffer 33.

The gate buffer 33 sequentially applies the shift pulses boosted at the level shifter 32 to the gate lines 17-1 to 17-m of the liquid crystal display unit 12 as vertical scanning pulses and selectively drives the pixels 11 of the liquid crystal display unit 12 in row units for vertical scanning.

Figure 7:
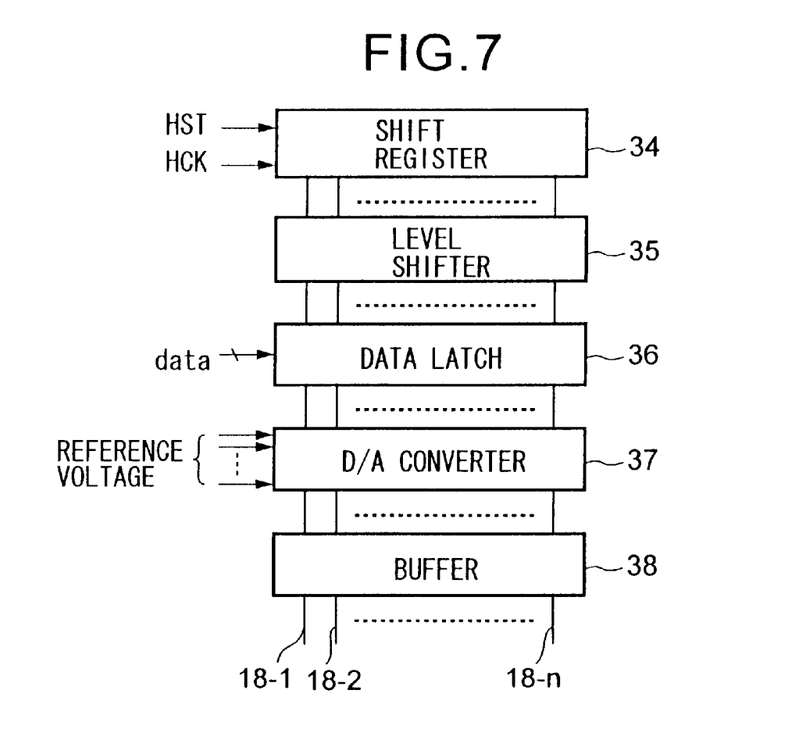
FIG. 7 is a block diagram of an example of the configuration of a horizontal driver in an active matrix type liquid crystal display device of an analog dot sequential driving system.

The horizontal driver (HD) 14, for example, as shown in FIG. 7, has a shift register 34, a level shifter 35, a data latch circuit 36, a D/A converter 37, and a buffer 38.

When input with the horizontal start pulse HST, the shift register 34 sequentially transfers the horizontal start pulse HST synchronized with the horizontal clock HCK and sequentially outputs shift pulses from the transfer stages to perform horizontal scanning.

The level shifter 35 boosts the shift pulses output from the transfer stages of the shift register 34 and supplies them to the data latch circuit 36.

The data latch circuit 36 responds to the shift pulses given from the shift register 34 through the level shifter 35 and sequentially latches predetermined bits of the digital image data DATA input.

The D/A converter 37 is for example configured as a reference voltage selection type which converts the digital image data latched at the data latch circuit 36 to analog image signals which it then gives to the signal lines 18-1 to 18-n of the liquid crystal display unit 12 through the buffer 38.

Figure 8A:
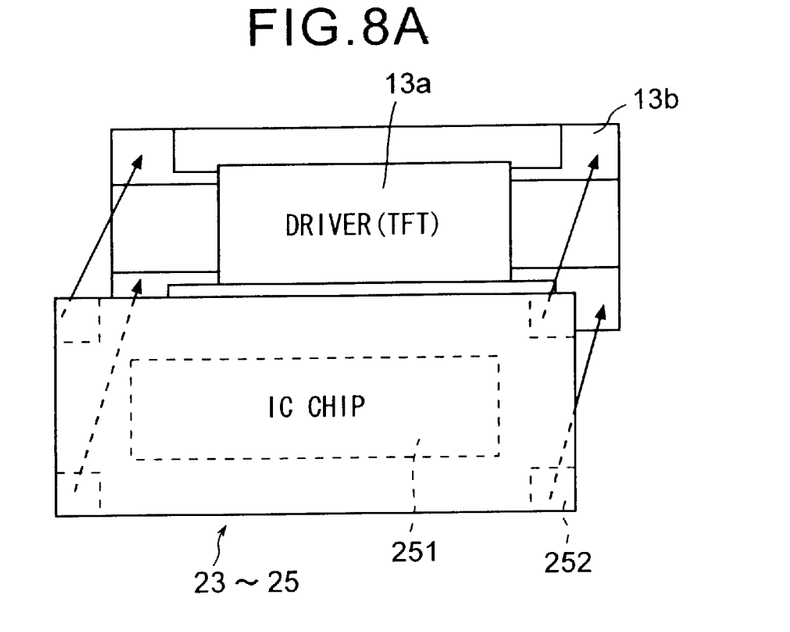

FIG. 8A is a view for explaining a method of connection of the control unit 15 formed by the silicon ICs 23 to 25 and the vertical driver (VD) 13 formed by polysilicon TFTs. Further, FIG. 8B is a sectional view of the connection portion.

As shown in FIG. 8A, to enable arrangement of the silicon ICs 23 to 25, the vertical driver (VD) 13 is formed with drive circuit areas 13a. Each drive circuit area 13a is configured connected to a plurality of pads 13b.

On the other hand, the silicon ICs 23 to 25, as shown in FIG. 8A, are formed with control circuit areas 251 on the silicon substrate 250. These control circuit areas 251 are configured electrically connected to bumps 252 through a plurality of not shown pads. Note that in FIG. 8A, the control circuit areas 251 and the bumps 252 are formed on the reverse side of the paper.

Figure 8B:
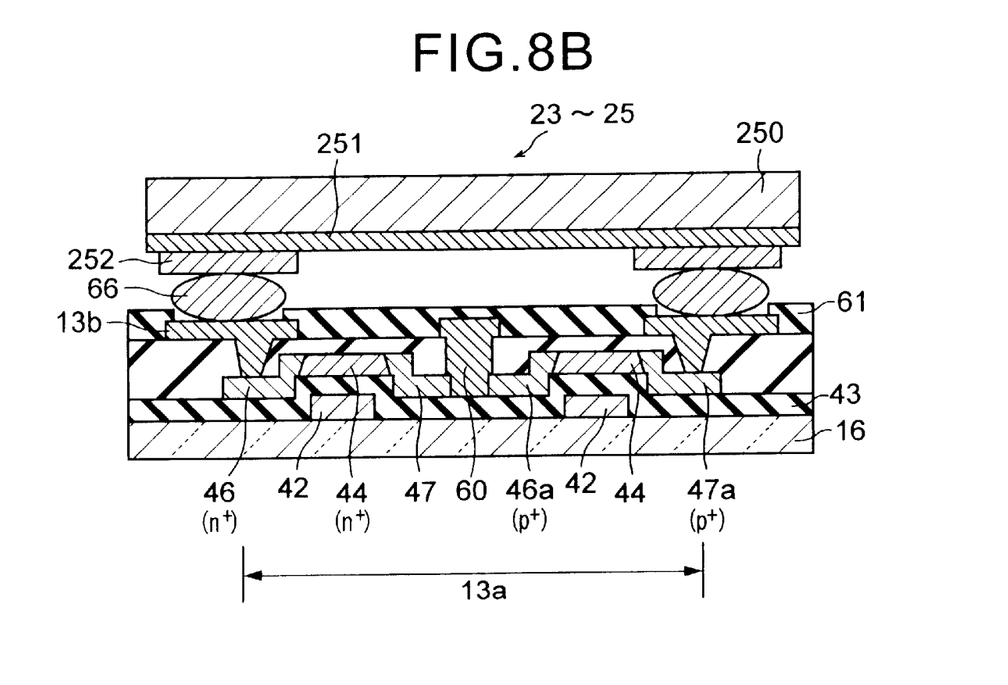
FIG. 8B is a sectional view of the connection portion.

Further, as shown in FIG. 8B, the drive circuit areas 13a of the vertical driver (VD) 13 and the control circuit areas 251 of the silicon ICs 23 to 25 are made to face each other. By mounting the bumps of the silicon ICs 23 to 25 on the pads 13b of the vertical driver (VD) 13 through a conductive particle material 66, electrical connection between the control circuits and the drive circuits is achieved.

Further the pads 13b are connected to not shown aluminum interconnections provided on the transparent insulating substrate 16. These aluminum interconnections are used for electrical connection between the IC chips 23 to 25 shown in FIG. 4 and electrical connection between the IC chips 23 to 25 and the horizontal and vertical drivers 13 and 14.

Note that FIG. 8B shows an example where the drive circuit area 13a is formed by complementary TFTs. Accordingly, a drain region 47 comprised of an $n^+$ diffusion layer of one TFT and a source region (drain region) 46a comprised of a $p^+$ diffusion region of another TFT are electrically connected by for example an aluminum interconnection 60. Further, a passivation film 61 is formed covering the complementary type TFT.

The operation of the liquid crystal display device of the above configuration will be explained next.

For example, image data DATA is input from an external CPU to the timing controller 23, whereby that image data DATA is supplied to the data latch circuit 36 of the horizontal driver (HD) 14.

Further, the reference voltage generation circuit 24 generates a plurality of reference voltages for use in the D/A converter 37 of the horizontal driver (HD) 14 and supplies them to not shown reference voltage lines of the D/A converter 37.

Next, a horizontal clock HCK and horizontal start pulse HST are input to the shift register 34 of the horizontal driver (HD) 14.

When input with the horizontal start pulse HST, the shift register 34 sequentially transfers the horizontal start pulse HST synchronized with the horizontal clock and sequentially outputs shift pulses from the transfer stages to the level shifter 35.

The level shifter 35 boosts the shift pulses output from the transfer stages of the shift register and supplies them to the data latch circuit 36.

The data latch circuit 36 responds to the shift pulses given from the shift register 34 through the level shifter 35 and sequentially latches predetermined bits of the digital image data DATA input from the timing controller 23.

The image data latched at the data latch circuit 36 is supplied to a reference voltage selection type D/A converter 37.

The D/A converter 37 selects the corresponding reference voltage, converts the digital image data to analog image signals, and supplies them as analog signals to the signal lines 18-1 to 18-n of the liquid crystal display unit 12 through the buffer 38.

When input with the vertical start pulse VST, the vertical driver (VD) 13 sequentially transfers the vertical start pulse VST synchronized with the vertical clock VCK and sequentially outputs shift pulses from the transfer stages to the level shifter 32.

Next, the level shifter 32 boosts the shift pulses output from the transfer stages of the shift register 31 and supplies them to the gate buffer 33.

The gate buffer 33 sequentially applies the shift pulses boosted at the level shifter 32 to the gate lines 17-1 to 17-m as vertical scanning pulses and selectively drives the pixels 11 of the liquid crystal display unit 12 in row units.

Due to this, the image data is written in parallel to the n number of pixels.

According to the liquid crystal display device according to the present embodiment, as circuit parts driven at a low speed and with large variance in characteristics, for example, the vertical driver (VD) 13 and horizontal driver (HD) 14 are formed using polysilicon TFTs, while as circuit parts driven at a high speed or circuit parts with small variance in characteristics, for example, the timing controller 23, reference voltage generation circuit 24, and DC-DC converter 25 of the control unit 15 are formed by single crystal silicon chips (ICs). Further, the circuit parts formed by ICs are mounted on the vertical driver (VD) 13 or other drive circuit parts by for example the COG method. Due to this, it is possible to reduce the frame portion of the liquid crystal display device.

Further, as shown in FIG. 3B, by making the total thickness t1 of the vertical driver (VD) 13 and the IC chips 23 to 25 less than the total thickness t3 of the facing transparent insulating substrate 62 and liquid crystal layer 63, the thickness t2 of the liquid crystal display device as a whole is no longer dependent on the thickness of the IC chips 23 to 25, so the liquid crystal display device can be made thinner.

That is, the total thickness t2 of the transparent insulating substrate 16, the transparent insulating substrate 62, and the liquid crystal layer 63 becomes the thickness of the liquid crystal display device.

Further, by making the peripheral circuits by ICs and mounting the IC chips on the transparent insulating substrate 16, it is possible to reduce the locations for electrical connection with outside circuits on the transparent insulating substrate 16, so it is possible to improve the reliability against mechanical vibration of the liquid crystal display device and possible to suppress the occurrence of defective electrical connections in the manufacturing process.

Note that when mounting the IC chips 23 to 25 on the transparent insulating substrate 16, a protective layer is formed on the silicon ICs at the time of fabrication, so there is no problem in reliability.

Second Embodiment

The present embodiment shows application of the present invention to an active matrix type liquid crystal display device of a time-division driving system (selector system).

Figure 9:
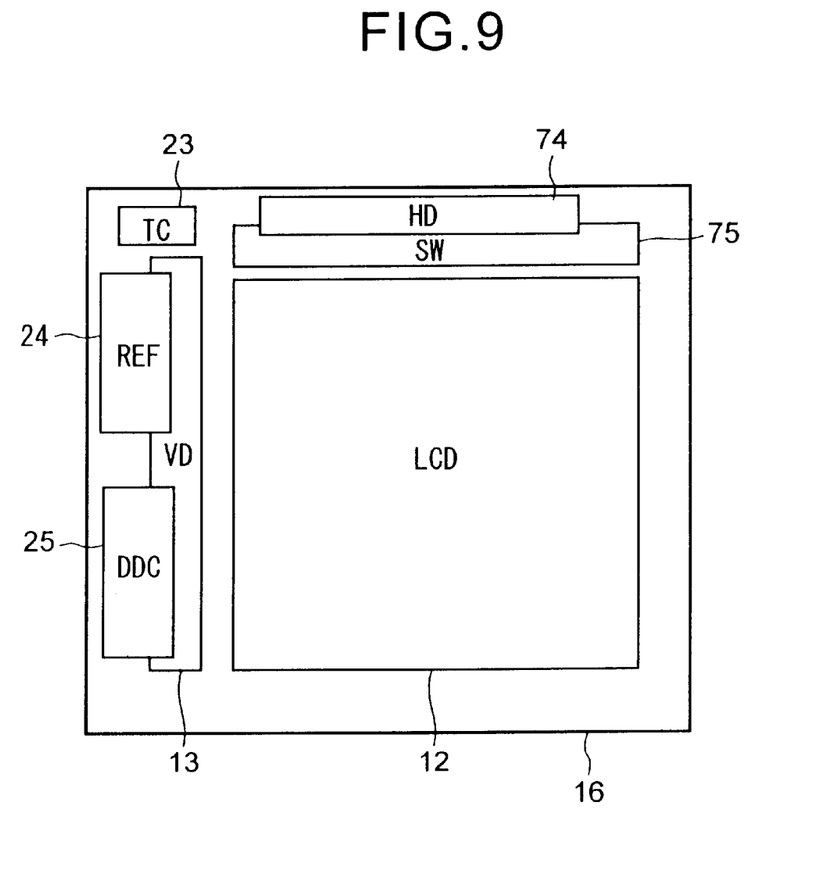
FIG. 9 is a schematic view of the layout of the circuits of the liquid crystal display device according to a second embodiment.

FIG. 9 is a schematic view of the layout of the circuits of an active matrix type liquid crystal display device of the time-division driving system to which the present invention is applied.

Figure 10:
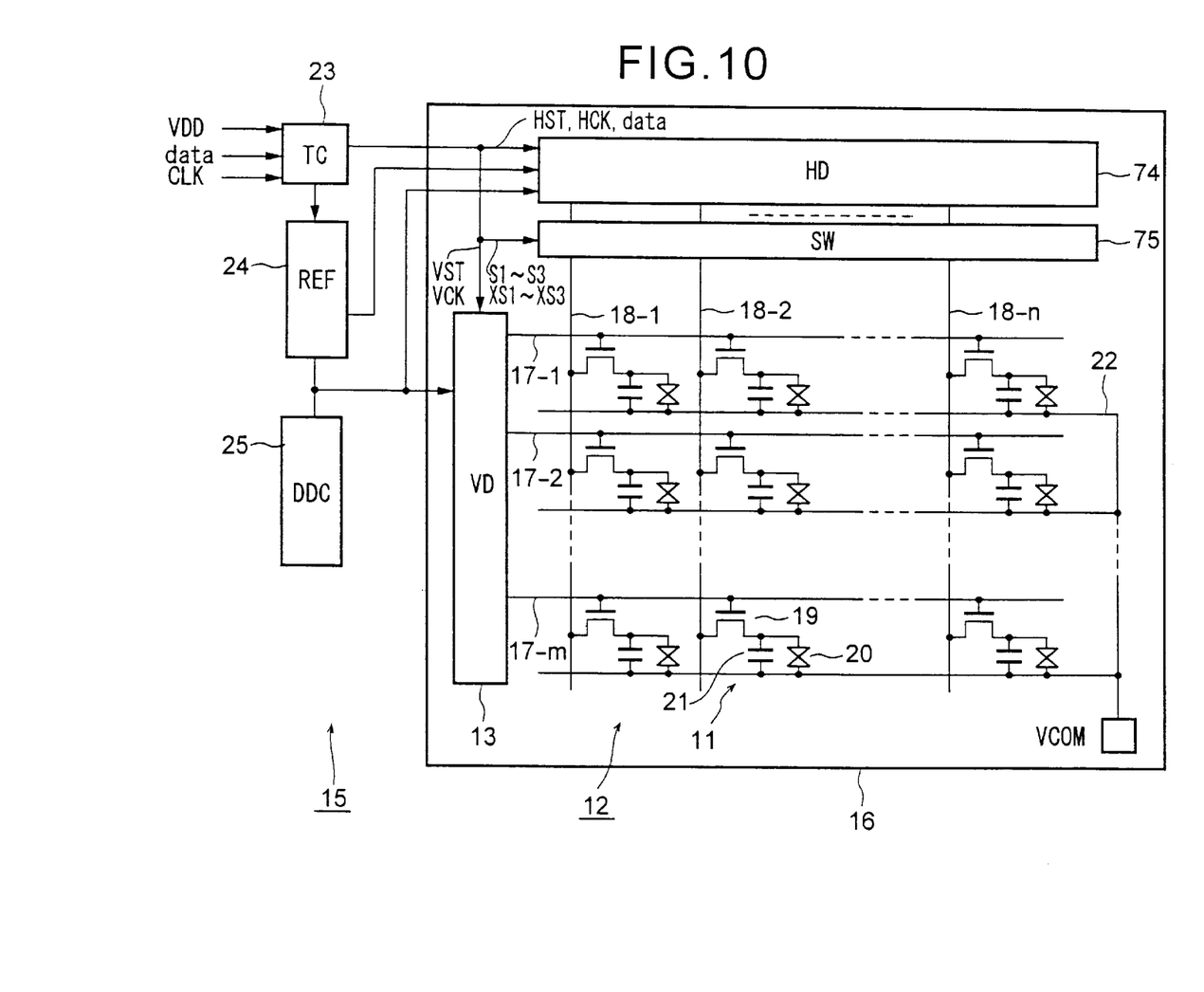
FIG. 10 is a schematic view of electrical connections of circuits of the liquid crystal display device shown in FIG. 9.

FIG. 10 is a schematic view of electrical connections of circuits of the liquid crystal display device shown in FIG. 9.

In FIG. 9 and FIG. 10, the liquid crystal display device according to the present embodiment is comprised of a liquid crystal display unit 12 comprised of a large number of pixels 11 arranged in a matrix, a vertical driver (VD) 13 for sequentially selecting the pixels 11 of the liquid crystal display unit 12 in row units, a horizontal driver (HD) 74 for writing pixel signals into the pixels 11 selected in row units, a time-division switch unit (SW) 75 for time-division driving, and a control unit 15 for controlling the vertical and horizontal drivers 13 and 74 and the time-division switch unit (SW) 75 mounted on a transparent insulating substrate 16.

Each of the pixels 11 is comprised of a polysilicon TFT 19 having a gate electrode connected to one of the gate lines 17-1 to 17-m and a source electrode connected to one of the signal lines 18-1 to 18-n, a liquid crystal cell 20 having a pixel electrode connected to a drain electrode of the TFT 19, and auxiliary electrostatic capacity 21 having one electrode connected to a drain electrode of the TFT 19.

In each of the pixels 11 of the above configuration, the counter electrode of the liquid crystal cell 20 is connected to a common line 22 along with the other electrode of the auxiliary electrostatic capacity 21. The common line 22 is given a predetermined DC voltage as a common voltage VCOM.

The control unit 15 for controlling the vertical driver (VD) 13, the horizontal driver (HD) 74, and the time-division switch unit (SW) 75 has a timing controller (TC) 23, reference voltage generation circuit (REF) 24, DC-DC converter (DDC) 25, etc.

The timing controller 23 receives as input through a not shown TCP (tape carrier package) a power source voltage VDD from a not shown external power source unit, digital image data DATA from a not shown external CPU, and a clock CLK from a not shown external clock generator.

The timing controller 23 controls the timing while supplying a vertical start pulse VST, vertical clock VCK, and other clock signals and various control signals to the vertical driver (VD), a horizontal start pulse HST, a horizontal clock HCK, and other clock signals and various control signals to the horizontal driver (HD) 74, and gate selection signals S1 to S3 and XS1 to XS3 to the time-division switch unit (SW) 75.

The reference voltage generation circuit 24 generates a plurality of reference voltages different in value and gives these plurality of reference voltages as reference voltages to the later mentioned reference voltage selection type D/A converter 88 of the horizontal driver (HD) 74.

The DC-DC converter 25 converts the low level DC voltage (low voltage) to two or more high DC voltages (high voltages) and gives them to the vertical driver (VD) 13, horizontal driver (HD) 74, reference voltage generation circuit 24, and other circuits.

In the active matrix type liquid crystal display device of the time-division driving system of the above configuration, the transistors forming the vertical driver (VD) 13 and the analog switches forming the time-division switch unit (SW) are formed on a transparent insulating substrate 16 the same as that of the liquid crystal display unit 12 by TFTs, in particular polysilicon TFTs the same as the transistors of the switching elements of the liquid crystal display unit 12.

On the other hand, the horizontal driver (HD) 74 and the timing controller 23, reference voltage generation circuit 24, and DC-DC converter 25 of the control unit 15 are formed by single crystal silicon ICs.

Further, the horizontal driver (HD) 74 formed by the silicon IC is mounted on the time-division selection switch unit 75, while the reference voltage generation circuit 24 and DC-DC converter 25 formed by silicon ICs are mounted on the vertical driver (VD) 13—all by for example the COG method.

Here, the time-division driving method will be explained together with the operation of the liquid crystal display of the present embodiment.

The "time-division driving method" is a method of driving by dividing the signal lines in a liquid crystal display unit 12 into units (blocks) of pluralities of adjoining lines and outputting signal voltages given to the plurality of signal lines in each block from the output terminals of the horizontal driver (HD) 74 in time series, while providing a time-division switch unit (SW) 75 dealing with units of pluralities of signal lines and using that time-division switch unit (SW) 75 to sample the time series signal voltages output from the horizontal driver (HD) 74 and sequentially give them to the plurality of signal lines.

To realize this time-division driving method, the horizontal driver (HD) 74 is configured to deal with units of pluralities of signal lines and output the signal voltages given to a plurality of signal lines in time series.

Figure 11:
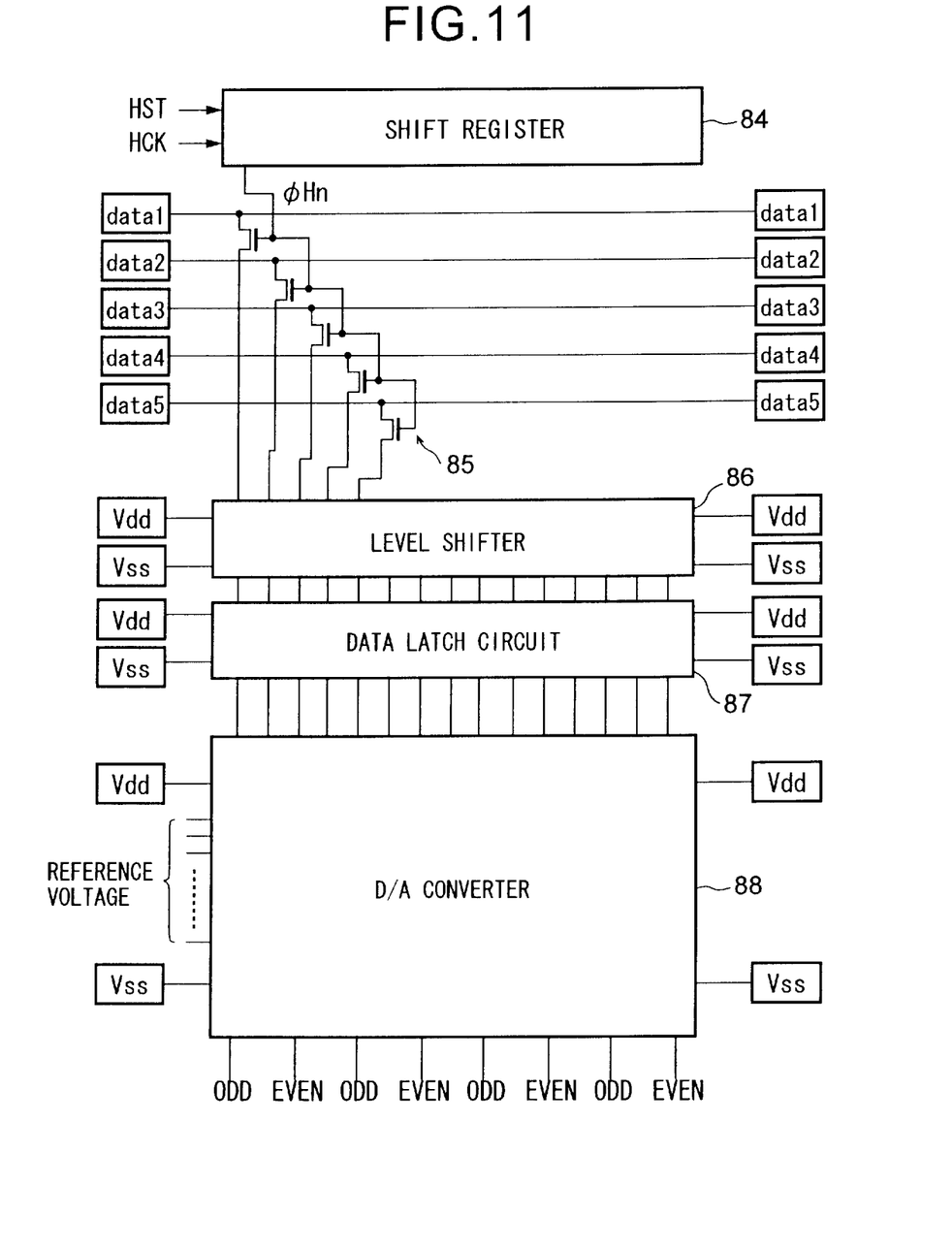
FIG. 11 is a block diagram of an example of the configuration of a horizontal driver in an active matrix type liquid crystal display device of a time-division driving system according to the second embodiment.

FIG. 11 shows an example of the configuration of the above horizontal driver 74.

The horizontal driver (HD) 74 shown in FIG. 11 has a shift register 84, a sampling switch group 85, a level shifter 86, a data latch circuit 87, and a D/A converter 88. In this embodiment, for example, it is configured to fetch the 5 bits of digital image data DATA1 to DATA5 and the power source voltages Vdd and Vss from the two sides of the shift register 84 in the shift direction.

In the horizontal driver (HD) 74 of the above configuration, when input with the horizontal start pulse HST, the shift register 84 sequentially transfers the horizontal start pulse HST in synchronization with the horizontal clock HCK so as to sequentially output shift pulses from the transfer stages and perform horizontal scanning.

The sampling switches in the sampling switch group 85 respond to the shift pulses (sampling pulses) sequentially output from the shift register 84 to sequentially sample the input digital image data DATA1 to DATA5.

The level shifter 86 boosts the for example 5V digital data sampled by the sampling switch group 85 to the digital data of the liquid crystal drive voltage.

The data latch circuit 87 is a memory for storing 1 H worth of the digital data boosted by the level shifter 86.

The D/A converter 88 is for example configured as a reference voltage selection type and outputs the 1 H worth of digital image data output from the data latch circuit 87 converted to analog image signals.

Further, as the horizontal driver (HD) 74, one of a so-called column inversion driving system is used.

The horizontal driver (HD) 74 realizes column inversion driving by outputting a signal voltage inverted in potential for each odd number and even number output terminal and inverting the polarity of the signal voltage for every field. Here, the "column inversion driving system" is a driving system where pixels adjoining each other in the horizontal direction have the same polarity and the states of the pixel polarities are inverted for every field.

On the other hand, the time-division switch unit (SW) 75 is configured by analog switches (transmission switches) for sampling the time series signal voltages output from the horizontal driver (HD) 74 by a time-division method.

Figure 12:
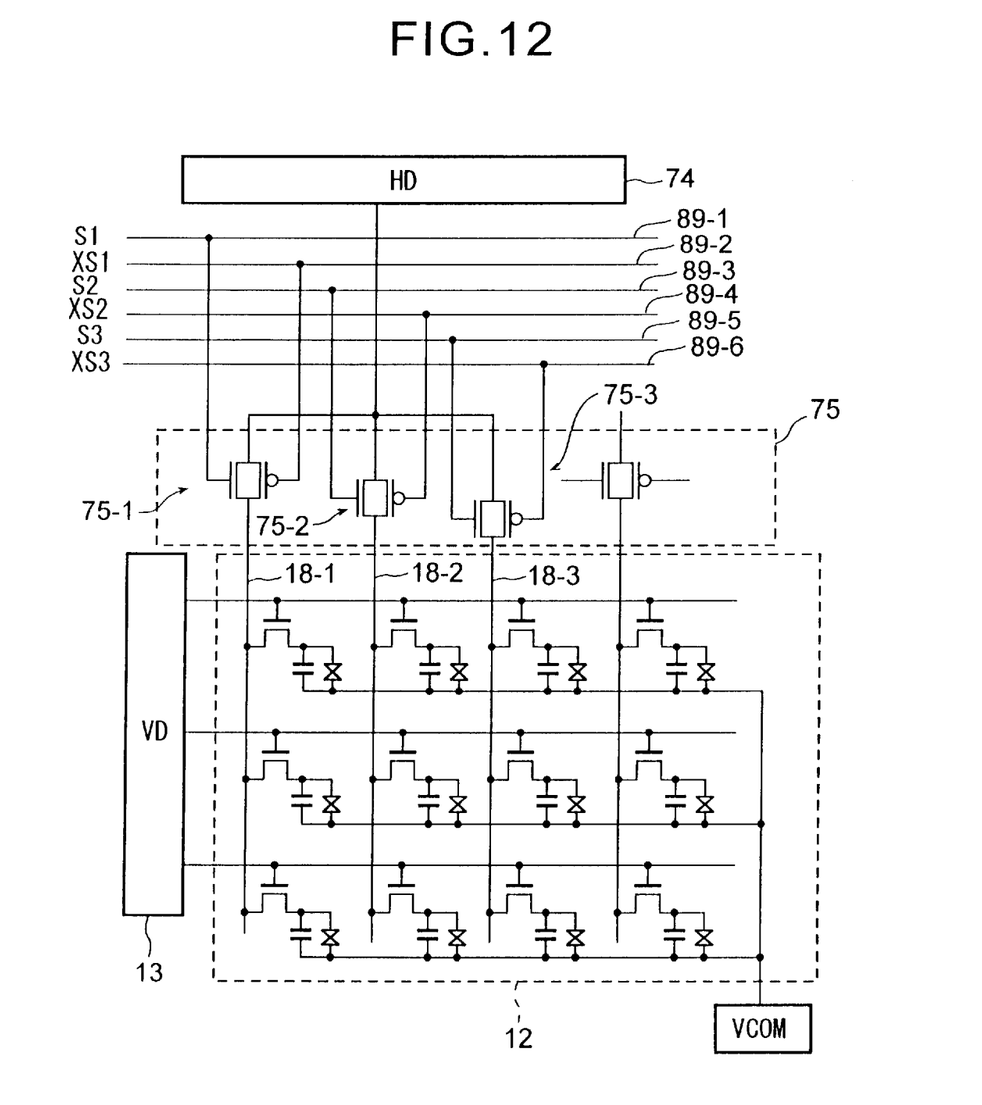
FIG. 12 is a circuit diagram of an example of the configuration of a time-division switch unit.

FIG. 12 shows an example of the configuration of a time-division switch unit (SW) 75.

One of the time-division switch units (SW) shown in FIG. 12 is provided for each output of the horizontal driver (HD) 74. Further, here, the case of three-way time-division driving for R (red), G (green), and B (blue) is shown as an example.

The time-division switch unit (SW) 75 is comprised of analog switches 75-1, 75-2, and 75-3 of a CMOS configuration where a p-channel MOS transistor and an n-channel MOS transistor are connected in parallel.

Note that in the present embodiment, CMOS configuration switches were used as the analog switches 75-1, 75-2, and 75-3, but it is also possible to use p-channel MOS transistors or n-channel MOS transistors.

In the time-division switch unit (SW) 75, the input ends of the three analog switches 75-1, 75-2, and 75-3 are connected in common while the output ends are connected to ends of the three signal lines 18-1, 18-2, and 18-3.

Further, the input ends of the analog switches 75-1, 75-2, and 75-3 are given signal potentials output in time series from the horizontal driver (HD) 74.

Further, a total of six control lines 89-1 to 89-6, or two for each analog switch, are arranged. Further, two control input ends of the analog switches 75-1, that is, the gates of the CMOS transistors, are connected to the control lines 89-1 and 89-2, two control input ends of the analog switches 75-2 are connected to the control lines 89-3 and 89-4, and two control input ends of the analog switch 75-3 are connected to the control lines 89-5 and 89-6.

The six control lines 89-1 to 89-6 are given gate selection signals S1 to S3 and XS1 to XS3 for sequentially selecting the three analog switches 75-1, 75-2, and 75-4 from the timing controller (TC) 23 (see FIG. 10). Here, the gate selection signals XS1 to XS3 are inverted signals of the gate selection signals S1 to S3.

The gate selection signals S1 to S3 and XS1 to XS3 sequentially turn on the three analog switches 75-1, 75-2, and 75-3 in synchronization with the time series signal potential output from the horizontal driver (HD) 74.

Due to this, the analog switches 75-1, 75-2, and 75-3 supply the time series signal potentials output from the horizontal driver (HD) 74 to the corresponding signal lines 18-1, 18-2, and 18-3 while sampling them by three-way time-division in a 1 H period.

In the liquid crystal display device according to the present embodiment, as circuit parts driven at a low speed and with large variance in characteristics, for example, the vertical driver (VD) 13 and time-division switch unit (SW) 75 are formed using polysilicon TFTs, while as circuit parts driven at a high speed or circuit parts with small variance in characteristics, for example, the horizontal driver (HD) 74 and the timing controller 23, reference voltage generation circuit 24, and DC-DC converter 25 of the control unit 15 are formed by single crystal silicon chips (ICs). Further, the circuit parts formed by ICs are mounted on the vertical driver (VD) 13 or the time-division switch unit (SW) 75 by for example the COG method. Due to this, it is possible to obtain similar effects as in the first embodiment.

Third Embodiment

The liquid crystal display devices according to the above first and second embodiments are suitable not only for use as display units of personal computers, word processors, and other office automation equipment or television receivers etc., but also particularly for use as display units of portable electronic devices such as mobile phones and PDAs (personal digital assistants), which are being made thinner and thinner.

Figure 13:
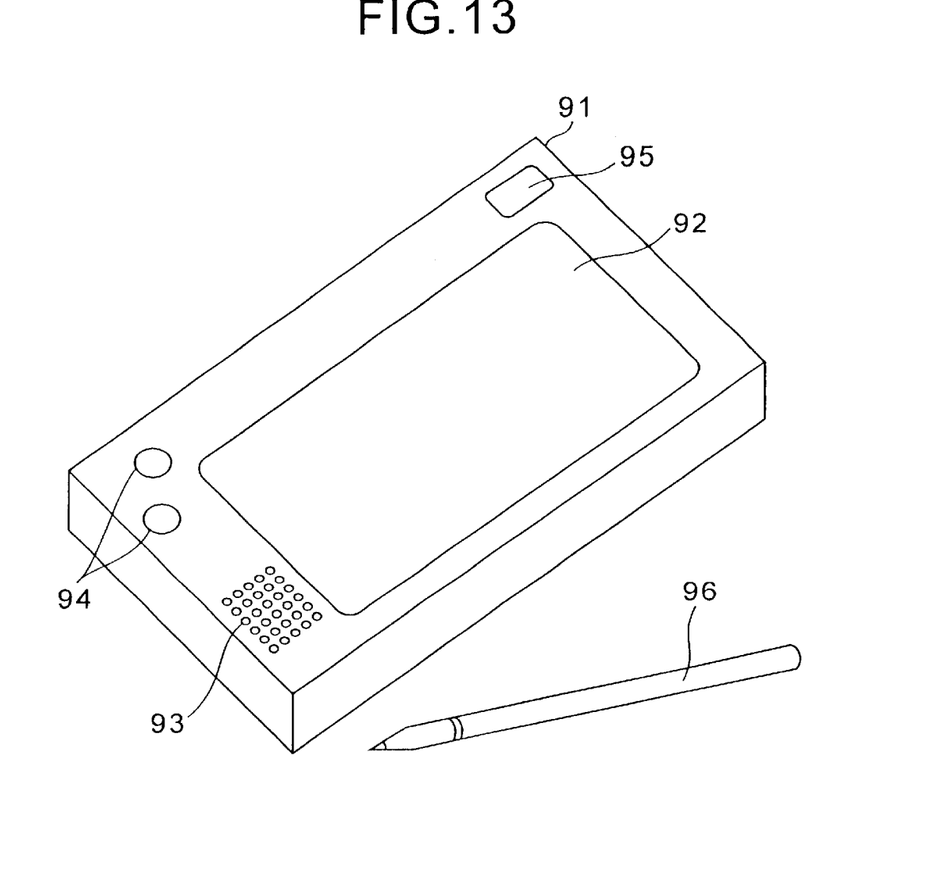
FIG. 13 is a perspective view of the schematic configuration of for example a PDA as an electronic device to which the present invention is applied.

FIG. 13 is a perspective view of the schematic configuration of for example a PDA as an electronic device mounting a liquid crystal display device according to the first and second embodiments.

The PDA according to this example is configured with a display unit 92, a speaker unit 93, an operation unit 94, and a power source unit 95 arranged at the front surface of the device housing 91.

Note that input to the PDA shown in FIG. 13 is possible by a pen 96 etc. on the display unit 92.

While not shown, the device housing 91 houses inside it a signal processing unit for performing desired signal processing to make the display unit 92 exhibit a desired display in accordance with the content of the operations and input by the operation unit 94 and pen 96 etc.

The display unit 92 of the PDA of this configuration uses a liquid crystal display device according to the first embodiment or second embodiment.

By using a liquid crystal display device of the present invention as the display unit 92 in a PDA, mobile phone, or other electronic device in this way, since the liquid crystal display device is configured to be made thinner and narrower in frame, there is the advantage that it can contribute greatly to the increased thinness and narrower frame of the housing of a portable electronic device such as a mobile phone.

The present invention is not limited to the explanation of the above embodiments.

For example, in the present embodiment, the CPU, memory storing the image data, and clock generator were provided outside of the liquid crystal display unit, but it is also possible to mount one or more of these on the liquid crystal display unit as part of the control unit.

Further, in the present embodiment, the example was shown of mounting the ICs of the control unit on the vertical driver by the COG method, but the invention is not limited to this. For example, mounting by the TAB (tape automated bonding) method etc. or mounting on the horizontal driver are also possible.

Various other modifications are possible within the scope of the gist of the present invention.

INDUSTRIAL APPLICABILITY

The present invention can be applied to a liquid crystal panel or other display device or to an electronic device provided with such a liquid crystal panel. Due to this, it is possible to realize a greater thinness, smaller area, and narrower frame of the display device and in turn the greater thinness, smaller area, and narrower frame of the electronic device using this as a display unit.

EXPLANATION OF REFERENCE NUMERALS

11 . . . pixel
12 . . . liquid crystal display unit (pixel unit)
13 . . . vertical driver
14, 74 . . . horizontal driver
15 . . . control unit
16 . . . transparent insulating substrate
19 . . . polysilicon TFT
20 . . . liquid crystal cell
23 . . . timing controller
24 . . . reference voltage generation circuit
25 . . . DC-DC converter
62 . . . transparent insulating substrate
63 . . . liquid crystal layer

What is claimed is:

1. A liquid crystal display device comprising
   a first substrate, a pixel unit formed on the first substrate and having pixels arranged in a matrix,
   a second substrate arranged facing the first substrate,
   a liquid crystal composition held between the first substrate and the second substrate, and
   peripheral circuits formed on the first substrate for writing pixel signals in the pixel unit,
   at least part of the peripheral circuits of the above peripheral circuits being formed by thin film transistors on the first substrate,
   the remaining part of the peripheral circuits of the above peripheral circuits being formed by semiconductor chips, and
   the semiconductor chips being arranged on the first substrate so that at least part of the semiconductor chips overlap the regions of the peripheral circuits formed by the thin film transistors.

2. A liquid crystal display device as set forth in claim 1, wherein said peripheral circuits formed by thin film transistors include
   a vertical driver for sequentially selecting pixels of said pixel unit in row units, and
   a horizontal driver for writing pixel signals in the pixels selected in row units by the vertical driver.

3. A liquid crystal display device as set forth in claim 1, wherein said peripheral circuits formed by thin film transistors include,
   a vertical driver for sequentially selecting pixels of said pixel unit in row units, and
   said peripheral circuits formed by semiconductor chips include a horizontal driver for writing pixel signals in the pixels selected in row units by the vertical driver.

4. A liquid crystal display device as set forth in claim 2 or 3, wherein said peripheral circuits formed by semiconductor chips include a timing controller for controlling the timing of selection of the pixels by the vertical driver and the timing for writing of the pixel signals to the pixels by the horizontal driver.

5. A liquid crystal display device as set forth in any one of claims 2 to 3, wherein said peripheral circuits formed by semiconductor chips include a reference voltage generator for outputting a reference voltage to said horizontal driver.

6. A liquid crystal display device as set forth in any one of claims 2 to 3, wherein said peripheral circuits formed by semiconductor chips include a DC-DC converter for generating at least two types of voltages higher than an input voltage and giving power to at least the vertical driver and the horizontal driver.

7. A liquid crystal display device as set forth in any one of claims 1 to 3, wherein the semiconductor chips are mounted on the first substrate by a COG method so that at least part of the semiconductor chips overlap regions of said peripheral circuits formed by thin film transistors.

8. A liquid crystal display device as set forth in claim 7, wherein connection parts for connecting the semiconductor chips by the COG method are formed at peripheral parts of said peripheral circuits formed by thin film transistors.

9. A liquid crystal display device as set forth in any one of claims 1 to 3, wherein as said peripheral circuits, the part of the peripheral circuits driven at a low speed are formed by thin film transistors, while the peripheral circuits driven at a higher speed than that part of the peripheral circuits are formed by semiconductor chips.

10. A liquid crystal display device as set forth in any one of claims 1 to 3, wherein a thickness of the semiconductor chips is smaller than a combined thickness of said liquid crystal composition on said first substrate and said second substrate.

11. An electronic device having a display unit for giving a desired display, an operation unit, and a signal processing unit for causing said display unit to give a desired display in accordance with the content of the operations by the operation unit, wherein the display unit comprises a first substrate, a pixel unit formed on the first substrate and having pixels arranged in a matrix, a second substrate arranged facing the first substrate, a liquid crystal composition held between the first substrate and the second substrate, and peripheral circuits formed on the first substrate for writing pixel signals to the pixel unit, at least part of the peripheral circuits of the above peripheral circuits being formed by thin film transistors on the first substrate, the remaining part of the peripheral circuits of the above peripheral circuits being formed by semiconductor chips, and the semiconductor chips being arranged on the first substrate so that at least part of the semiconductor chips overlap the regions of the peripheral circuits formed by the thin film transistors.

12. An electronic device as set forth in claim 11, wherein said peripheral circuits formed by thin film transistors include a vertical driver for sequentially selecting pixels of said pixel unit in row units, and a horizontal driver for writing pixel signals in the pixels selected in row units by the vertical driver.

13. An electronic device as set forth in claim 11, wherein
said peripheral circuits formed by thin film transistors include a vertical driver for sequentially selecting pixels of said pixel unit in row units, and said peripheral circuits formed by semiconductor chips include a horizontal driver for writing pixel signals in the pixels selected in row units by the vertical driver.

14. An electronic device as set forth in claim 12 or 13, wherein said peripheral circuits formed by semiconductor chips include a timing controller for controlling the timing of selection of the pixels by the vertical driver and the timing for writing of the pixel signals to the pixels by the horizontal driver.

15. An electronic device as set forth in any one of claims 12 to 13, wherein said peripheral circuits formed by semiconductor chips include a reference voltage generator for outputting a reference voltage to said horizontal driver.

16. An electronic device as set forth in any one of claims 12 to 13, wherein said peripheral circuits formed by semiconductor chips include a DC-DC converter for generating at least two types of voltages higher than an input voltage and giving power to at least the vertical driver and the horizontal driver.

17. An electronic device as set forth in any one of claims 11 to 13, wherein the semiconductor chips are mounted on the first substrate by a COG method so that at least part of the semiconductor chips overlap regions of said peripheral circuits formed by thin film transistors.

18. An electronic device as set forth in claim 17, wherein connection parts for connecting the semiconductor chips by the COG method are formed at peripheral parts of said peripheral circuits formed by thin film transistors.

19. An electronic device as set forth in any one of claims 11 to 13, wherein as said peripheral circuits, the part of the peripheral circuits driven at a low speed are formed by thin film transistors, while the peripheral circuits driven at a higher speed than that part of the peripheral circuits are formed by semiconductor chips.

20. An electronic device as set forth in any one of claims 11 to 13, wherein a thickness of the semiconductor chips is smaller than a combined thickness of said liquid crystal composition on said first substrate and said second substrate.

* * * * *